United States Patent  (10) Patent No.: US 9,666,967 B2
Bosscher et al.  (45) Date of Patent: May 30, 2017

(54) PRINTED CIRCUIT BOARD CONNECTOR FOR NON-PLANAR CONFIGURATIONS

(71) Applicant: Apple Inc., Cupertino, CA (US)

(72) Inventors: Nathan P. Bosscher, Cupertino, CA (US); Craig M. Stanley, Cupertino, CA (US); Trent K. Do, Cupertino, CA (US); John J. Baker, Cupertino, CA (US); Phillip M. Hobson, Cupertino, CA (US); Brad G. Boozer, Cupertino, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 14/444,424

(22) Filed: Jul. 28, 2014

(65) Prior Publication Data

US 2016/0028173 A1  Jan. 28, 2016

(51) Int. Cl.
*H01R 12/73* (2011.01)
*H05K 3/36* (2006.01)
*H01R 35/04* (2006.01)
*H01R 12/72* (2011.01)

(52) U.S. Cl.
CPC .......... *H01R 12/732* (2013.01); *H01R 35/04* (2013.01); *H05K 3/36* (2013.01); *H01R 12/722* (2013.01)

(58) Field of Classification Search
CPC ...... H01R 12/72; H01R 12/73; H01R 12/732; H01R 12/716; H01R 12/52; H01R 35/04
USPC .............................. 439/31, 65, 928; 361/785
See application file for complete search history.

(56) References Cited

U.S. PATENT DOCUMENTS

| 4,657,320 | A | * | 4/1987 | Bamford ................ H01R 35/04 439/31 |
| 5,111,363 | A | | 5/1992 | Yagi et al. |
| 5,125,846 | A | * | 6/1992 | Sampson ............. H01R 4/2429 439/170 |
| 6,344,877 | B1 | | 2/2002 | Gowda et al. |
| 6,851,831 | B2 | * | 2/2005 | Karlicek, Jr. .......... H01R 29/00 362/227 |
| 6,866,544 | B1 | | 3/2005 | Casey et al. |
| 7,106,261 | B2 | | 9/2006 | Nagel et al. |
| 7,123,292 | B1 | | 10/2006 | Seeger et al. |
| 7,130,174 | B2 | | 10/2006 | Miyai et al. |
| 7,380,948 | B2 | | 6/2008 | Schofield et al. |
| 7,619,899 | B2 | | 11/2009 | Rubenstein et al. |

(Continued)

FOREIGN PATENT DOCUMENTS

WO WO 2012058295 5/2012

OTHER PUBLICATIONS

Author Unknown, "Copper Flex Products," www.molex.com, 6 pages, at least as early as Jul. 22, 2014.

*Primary Examiner* — Tulsidas C Patel
*Assistant Examiner* — Marcus Harcum
(74) *Attorney, Agent, or Firm* — Michael H. Lyons (57) ABSTRACT

A mesh network of printed circuit boards (PCBs) including a first PCB coupled to a second rigid PCB by way of an interlocking connection is provided. The interlocking connection has a degree of freedom that allows the first and second PCBs to form a twist angle between each other; the interlocking connector configured to provide electrical coupling between active components disposed in each of the first and second PCBs. A method of forming a substrate fabric including a mesh network as above is also provided. Further provided is a method of activating the mesh network of printed circuit boards as above.

14 Claims, 10 Drawing Sheets

(56) References Cited

U.S. PATENT DOCUMENTS

| | | |
|---|---|---|
| 7,822,338 B2 | 10/2010 | Wernersson |
| 7,978,489 B1 | 7/2011 | Telefus et al. |
| 7,989,709 B2 | 8/2011 | Tsao |
| 8,187,006 B2 * | 5/2012 | Rudisill ............... H01R 11/30 362/249.06 |
| 8,361,830 B2 | 1/2013 | Yang et al. |
| 8,385,258 B2 * | 2/2013 | Perlman ............. H04L 63/0428 370/326 |
| 8,430,402 B2 | 4/2013 | Diehl et al. |
| 8,500,456 B1 * | 8/2013 | Holec .................... H01R 4/02 439/65 |
| 8,730,372 B2 | 5/2014 | Dabov |
| 8,905,684 B2 * | 12/2014 | Waggle ................... B23C 5/08 407/109 |
| 9,035,326 B2 | 5/2015 | Cho |
| 9,209,627 B2 | 12/2015 | Baarman et al. |
| 2005/0095410 A1 | 5/2005 | Mazurkiewicz |
| 2005/0233122 A1 | 10/2005 | Nishimura et al. |
| 2007/0032130 A1 * | 2/2007 | Yoshino ............... H05K 1/0218 439/578 |
| 2009/0213232 A1 | 8/2009 | Asakura et al. |
| 2010/0118532 A1 * | 5/2010 | Liang ..................... F21S 2/005 362/235 |
| 2010/0141571 A1 | 6/2010 | Chiang et al. |
| 2010/0177080 A1 | 7/2010 | Essinger et al. |
| 2011/0133208 A1 * | 6/2011 | Nakahara ............... H01L 33/20 257/76 |
| 2011/0155417 A1 * | 6/2011 | Hu ....................... H01B 7/0018 174/116 |
| 2011/0304763 A1 | 12/2011 | Choi et al. |
| 2012/0133208 A1 * | 5/2012 | Kalhoff .................. G01D 4/002 307/71 |
| 2012/0270420 A1 * | 10/2012 | Lapidot ............. H01R 13/6471 439/65 |
| 2013/0082984 A1 | 4/2013 | Drzaic et al. |
| 2013/0178093 A1 * | 7/2013 | Altice ................ G05B 19/0428 439/488 |
| 2014/0111953 A1 | 4/2014 | McClure et al. |
| 2014/0342577 A1 * | 11/2014 | De Bruijn ............ H01R 12/732 439/31 |
| 2015/0116958 A1 | 4/2015 | Shedletsky et al. |
| 2015/0138700 A1 | 5/2015 | Goyal et al. |
| 2015/0146355 A1 | 5/2015 | Goyal et al. |
| 2015/0194753 A1 | 7/2015 | Raff et al. |
| 2015/0295332 A1 | 10/2015 | Shedletsky et al. |
| 2016/0021742 A1 | 1/2016 | Johansson et al. |

* cited by examiner

PRINTED CIRCUIT BOARD CONNECTOR FOR NON-PLANAR CONFIGURATIONS

TECHNICAL FIELD

Embodiments described herein relate generally to devices, systems and methods for linking a plurality of electronic boards in non-planar configurations and more particularly to connectors and connector assemblies for linking at least two printed circuit boards (PCBs) in a non-coplanar configuration.

BACKGROUND

In the field of consumer electronics, miniaturization of devices has led to configurations where the aggregated effect of multiple small devices may provide a more powerful and better-integrated performance. Where multiple units are linked together, the linkage between the units should often be strong and compliant to withstand operational stresses and inadvertent shocks. The result is often a configuration where all units are meshed together so that replacement of a single element requires disassembly of the entire configuration. The need to disassemble an aggregated structure when a piece or component fails may lead to replacement of the entire structure upon a single element malfunction. This creates undesirable costs that eventually are reflected in the marketability of the product.

Therefore, what is desired is a device having connectors that enable to link multiple devices in a mesh network and allowing the replacement of a single unit within the mesh network, as desired.

SUMMARY

In a first embodiment a mesh network of printed circuit boards (PCBs) may include a first PCB coupled to a second rigid PCB by way of an interlocking connection. The interlocking connection has a degree of freedom that allows the first and second PCBs to form a twist angle between each other; the interlocking connector configured to provide electrical coupling between active components disposed in each of the first and second PCBs.

Another embodiment may take the form of a substrate fabric. In the context of the present disclosure, a substrate fabric is a mesh network of substrates that conforms to a volume with arbitrary shape forming a three-dimensional surface. The substrate fabric may include a plurality of substrates having active electrical components and further including a plurality of substrates linked together to form a curved surface, and at least two adjacent substrates each having a first linkable element and a second linkable element, and each linkable element including a conductive material. Accordingly, the first linkable element in one of the at least two adjacent substrates engages the second linkable element in the other one of the at least two adjacent substrates. The substrate fabric also includes a plurality of traces for electrical power lines and data transmission lines. Each of the traces may have at least one electrical connection formed between the first linkable element engaging the second linkable element in the at least two adjacent substrates.

Yet another embodiment may be a method of forming a substrate fabric. The method may include joining two substrates, forming a chain of joined substrates, adapting the chain to a desired shape, and forming a plurality of chains linked together into a fabric.

Other aspects and advantages of the invention will become apparent from the following detailed description taken in conjunction with the accompanying drawings which illustrate, by way of example, the principles of the described embodiments.

BRIEF DESCRIPTION OF THE DRAWINGS

The described embodiments may be better understood by reference to the following description and the accompanying drawings. Additionally, advantages of the described embodiments may be better understood by reference to the following description and accompanying drawings. These drawings do not limit any changes in form and detail that may be made to the described embodiments. Any such changes do not depart from the spirit and scope of the described embodiments.

In the figures, elements referred to with the same or similar reference numerals include the same or similar structure, use, or procedure, as described in the first instance of occurrence of the reference numeral.

DETAILED DESCRIPTION

Representative applications of methods and apparatuses according to the present application are described in this section. These examples are being provided solely to add context and aid in the understanding of the described embodiments. It will thus be apparent to one skilled in the art that the described embodiments may be practiced without some or all of these specific details. In other instances, well known processes, elements and/or configurations have not been described in detail in order to avoid unnecessarily obscuring the described embodiments. Other applications are possible, such that the following examples should not be taken as limiting.

In the following detailed description, references are made to the accompanying drawings, which form a part of the description and in which are shown, by way of illustration, specific embodiments in accordance with the described embodiments. Although these embodiments are described in sufficient detail to enable one skilled in the art to practice the described embodiments, it is understood that these examples are not limiting; such that other embodiments may be used, and changes may be made without departing from the spirit and scope of the described embodiments.

In the field of consumer electronics, aggregation of multiple miniaturized devices is convenient in order to create more flexible and powerful performance. An aggregated structure or "fabric" of multiple devices may desirably have a non-planar shape, in order to improve performance. In the context of the present disclosure, a fabric is understood as a three-dimensional mesh network that conforms to a volume with arbitrary shape forming a three-dimensional surface. For example, multiple displays may be configured together around a curved surface that better adapts to a body part, such as an arm, a leg, the head, or a part of the human body. In some embodiments a multiplicity of speakerphones may be put together in a fabric that better adapts to the acoustic requirements of certain applications. A fabric of multiple components as disclosed herein may include a speakerphone and a microphone. In some embodiments, a spherical arrangement of speakerphones and microphones may be conveniently adapted for a stereophonic result (such as in a soccer ball configuration). In general, any type of electronic device may be included in a fabric consistent with embodiments disclosed herein. For example, miniaturized sensors may be conformed into fabrics having any desired shapes. A miniaturized sensor may include a pressure sensor, a temperature sensor, or a touch sensor such as a touch sensitive screen, or any combination of the above. Further and according to some embodiments, a sensor may include a biometric sensor to measure bodily temperature, or other parameters associated with a physiological function.

Accordingly, adjacent substrates in embodiments consistent with the present disclosure may form non-planar configurations. Non-planar configurations as disclosed herein may include adjacent substrates in planes orthogonal to one another (i.e. forming a 90° angle between the planes). Furthermore, non-planar configurations as disclosed herein may include adjacent substrates in planes non-orthogonal to one another. More generally, a fabric as disclosed herein may include a network mesh of substrates coupled through multiple interconnection paths. The fabric may form a three-dimensional (3D) network mesh of PCBs where a single printed circuit board (PCB) may be extracted, replaced, without compromising the geometry of the overall 3D-mesh or fabric. In that regard, substrates forming a 3D-network mesh as in embodiments disclosed herein may be plug-and-play active electronic devices or sensors. Thus, replacing one of the substrates may have minimal or no impact in the performance of the aggregated system and may not require replacement of the entire system.

In some embodiments, substrates arranged in a 3D-mesh network as disclosed herein may be solar panels adapted to have a shape that receives solar radiation at different angles during the passing of the day.

Figure 1:
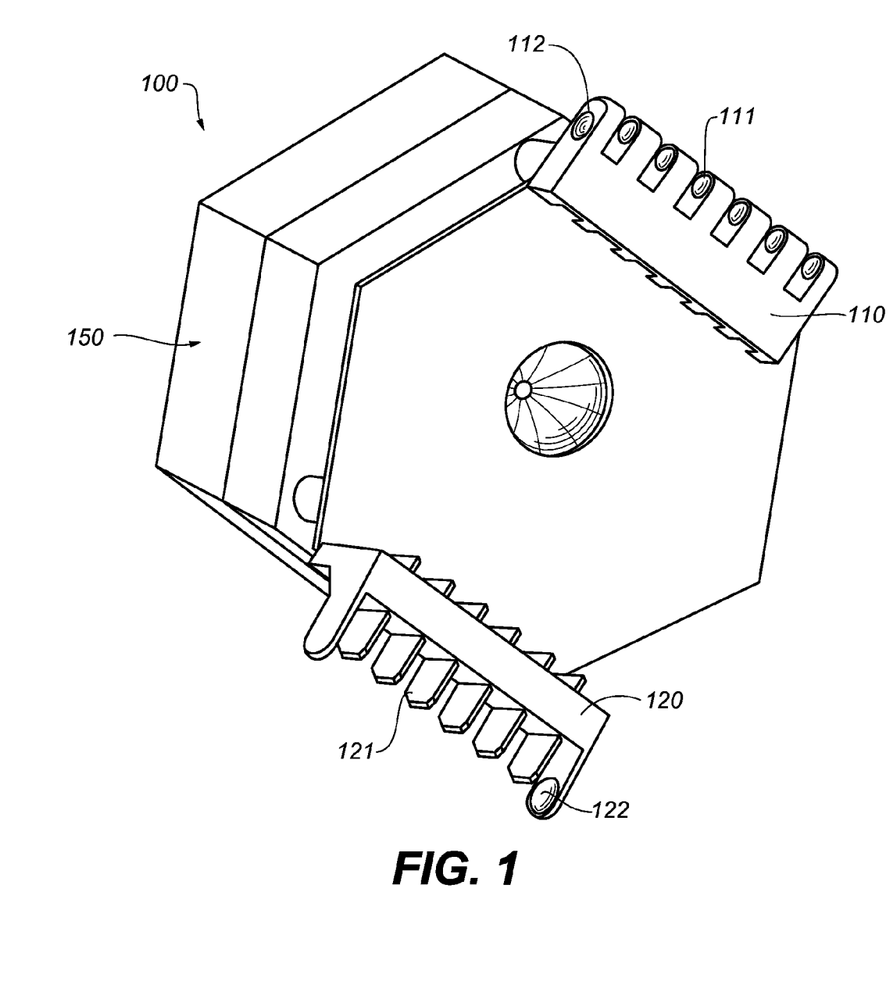
FIG. 1 illustrates a substrate including board to board connectors for a non-planar configuration, according to some embodiments.

FIG. 1 illustrates a substrate 100 including board to board connectors 110 and 120 for a non-planar configuration, according to some embodiments. Substrate 100 includes an active electrical component 150. Active electrical component 150 may include an acoustic element, such as a speakerphone, or a microphone, or a sensor. In that regard, substrate 100 may include a PCB having active circuitry to control and receive data from active component 150. Active electrical component 150 may include a transducer, such as a speaker diaphragm, a capacitor, a light emitting diode (LED), or any other active device, sensor, or transducer.

Connector 110 typically includes a plurality of contact pins 111 and a securing mechanism, such as a latching detent 112. Connector 120 includes a plurality of contact blades 121 and another securing mechanism, again such as a latching detent 122. Accordingly, contact blades 121 of a first substrate 100 are configured to fit within contact pins 111 of a second substrate 100, the first and second substrates thus forming a link. Without loss of generality, connector 110 may be referred to as a pin connector, to distinguish from connector 120, referred to as a blade connector. More generally, connector 110 may be referred to as a first connector and connector 120 may be referred to as a second connector.

Accordingly, connector 110 in a first substrate matches or fits into connector 120 from a second substrate. In some embodiments, connector 110 may be similar or identical to connector 120, and in some embodiments connector 110 and connector 120 may differ from each other so that they fit tightly into one another. In that regard, first connector 110 in a substrate 100 and second connector 120 in an adjacent substrate may form an interlocking connection to mechanically and electrically secure substrate 100 to the adjacent substrate.

In some embodiments, contact blades 121 may be squeezed tightly between contact pins 111. The pressure of contact pins 111 onto contact blades 121 provides a force that mechanically couples the first substrate with the second substrate. Latching detents 112 and 122 are configured to pressure fit into each other when a first substrate 100 is coupled to a second substrate through operation of board connectors 110, 120. Thus, when latching detent 112 in the first substrate 110 engages latching detent 122 in the second substrate 120, the pressure fit provides mechanical coupling for the first substrate with the second substrate, in addition to the engagement between pins 111 and blades 121. In some embodiments, either one of latching detent 112 and latching detent 122, or both, may be formed of a hard material such as a plastic, or a metal. Moreover, in some embodiments latching detent 112 and latching detent 122 may protrude out of board 100 further than pins 111 and blades 121.

Pins 111 and blades 121 are electrically coupled to active circuitry in board 100, providing electrical power and data transmission between board 100 and external devices. Accordingly, in some embodiments pins 111 and blades 121 may be soldered to connector pads inside board 100. In that regard, pins 111 and blades 121 may be formed of an electrically conductive material such as a metal. In some embodiments connectors 110 and 120 may be hinged onto board 100, providing a degree of freedom for the relative positioning of the plurality of pins 111 and the plurality of blades 121 relative to a plane including substrate 100. Thus, pin connector 110 in substrate 100 forms an interlocking connection with blade connector 120 in an adjacent substrate providing a secure mechanical coupling. Also, pin connector 110 and blade connector 120 provide designed flexibility to the relative orientation of a plane including substrate 100 and a plane including the adjacent substrate. Accordingly, coupling through connectors 110 and 120 enables a non-planar configuration between substrate 100 and the adjacent substrate.

Although the connector is shown has having a hexagonal shape, it should be understood that the shape of the connector can vary between embodiments and as used in various electronic devices or in other applications. As non-limiting examples, connectors may be round, cylindrical, square, or have any necessary or suitable polyhedron shape. Further, the top and/or bottom surfaces of the connector need not be flat. The foregoing applies to the various embodiments of connectors shown and/or described throughout this document.

Figure 2A:
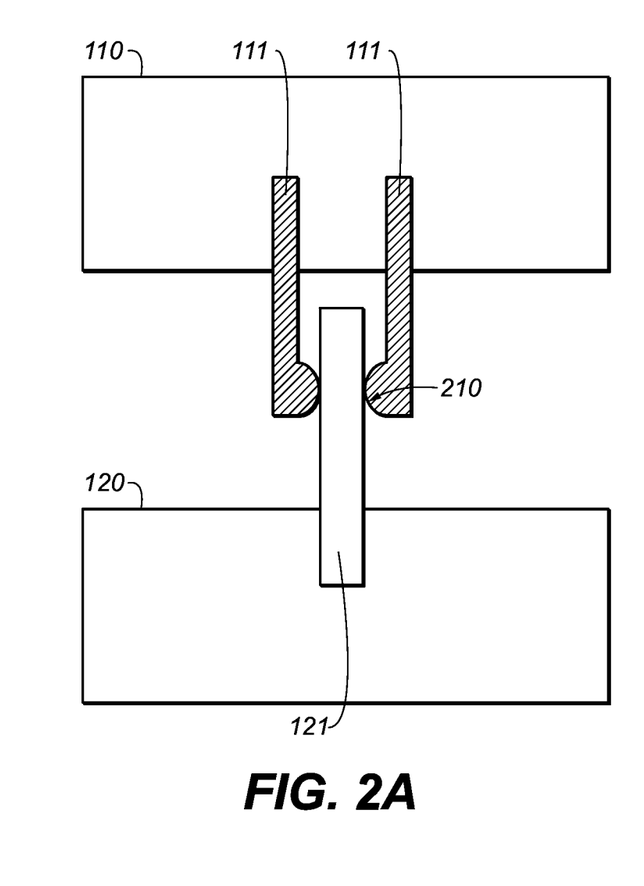
FIG. 2A illustrates a detail of a board to board connector for a substrate in a non-planar configuration, according to some embodiments.

FIG. 2A illustrates a detail of a board to board connector for a substrate in a non-planar configuration, according to some embodiments. FIG. 2A illustrates connector 110 from a first substrate engaging connector 121 from a second substrate adjacent to the first substrate. Contact pins 111 in connector 110 include a contact feature 210 that presses onto blade contact 121 in connector 120. Contact feature 210 may be a protrusion or dimple having a spherical shape, or a convex shape. In that regard, pins 111 may resemble a beam with dimples 210 at the end, such that dimples 210 press onto blades 121. While pressing onto blade 121, contact pins 111 provide electrical coupling between the first substrate and the second substrate while adapting to a slight misalignment between pins 111 and blades 121. Contact feature 210 ensures that electrical contact is maintained while allowing for connector 110 and connector 120 to form an angle relative to each other. The angle between connectors may be non-zero (e.g., connectors 110 and 120 may not be parallel), and contact feature 210 may still allow electrical power and data transmission from the first substrate to the second substrate. More generally, the first substrate and the second substrate may be non-planar while contact feature 210 allows electrical coupling between the first substrate and the second substrate.

Figure 2B:
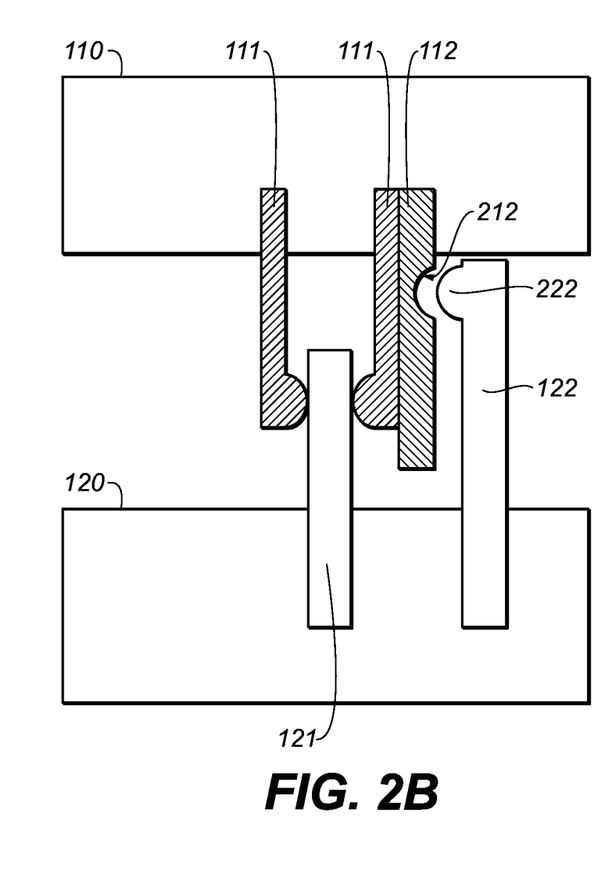
FIG. 2B illustrates a detail of a board to board connector for a substrate in a non-planar configuration, according to some embodiments.

FIG. 2B illustrates a detail of a board to board connector for a substrate in a non-planar configuration, according to some embodiments. FIG. 2B illustrates the end portion of connector 110 engaging the end portion of connector 120. Contact pins 111, contact feature 210, and contact blade 121 are as described in detail above (cf. FIG. 1 and FIG. 2A). A convex protrusion 222 from latching detent 122 fits into a concave indentation in latching detent 112. One of ordinary skill will recognize that in some embodiments a concave indentation in latching detent 122 fits into a convex protrusion in latching detent 112. In that regard, latching detent 112 in connector 110 matches with latching detent 122 in connector 120. Engagement of latching detent 112 with latching detent 122 provides mechanical coupling between connector 110 and connector 120. As illustrated in FIG. 2B, latching detent 222 may be a ball-shaped detent to allow for a degree of misalignment between pins 111 and blades 121. In some embodiments, latching detent 122 may be located in the center of contact 120, rather than in the edge as illustrated in FIGS. 1 and 2B. For example, connectors 110 and 120 may have a single latching detent in the center of the interlocking assembly, thus providing a wider degree of twisting between the planes of adjacent substrates.

While FIGS. 2A and 2B illustrate a single blade 121 in connector 120 and two pins 111 in connector 110, any number of blades and pins may be included. Furthermore, each connector 110 or 120 may include both electrical power lines and data transmission lines across one, two, or any number of pins and blades.

Figure 2C:
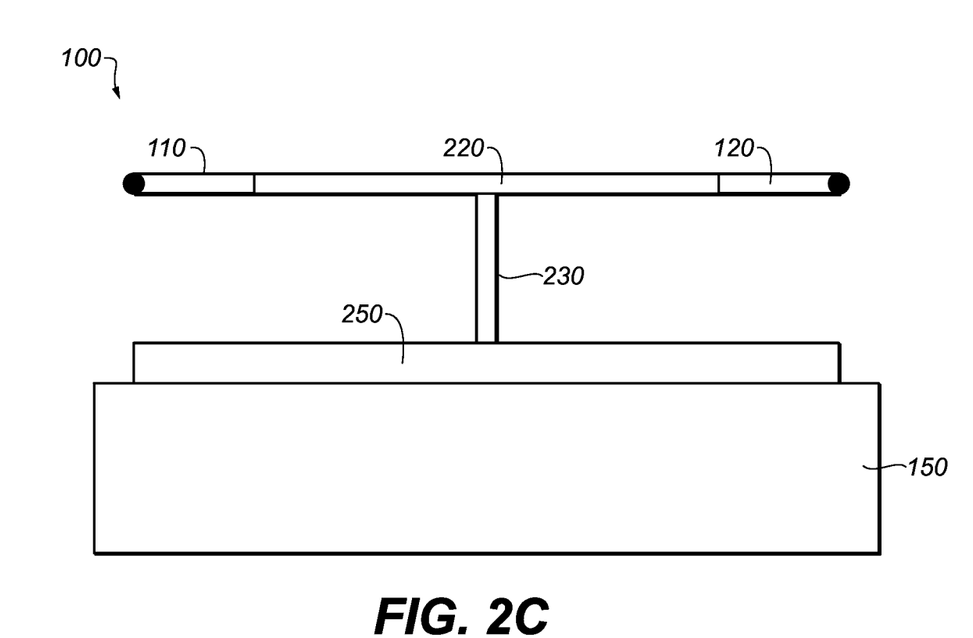
FIG. 2C illustrates a side view of a substrate in a non-planar configuration, according to some embodiments.

FIG. 2C illustrates a side view of a substrate in a non-planar configuration, according to some embodiments. Substrate 100 includes board connectors 110 and 120, a bypass component 220, a collection pin 230, a board 250, and active component 150. Accordingly, collection pin 230 feeds electrical power and data to board 250 at a single point. Bypass component 220 reduces the impedance of the electrical power and data channels through a plurality of substrates 100 linked to form a chain. Such configuration having a bypass component may be desirable in applications where a large amount of electrical power flows from connector 110 to connector 120 along an electrical power line. A chain of substrates according to some embodiments will be described in detail in relation to FIG. 3, below.

Figure 3:
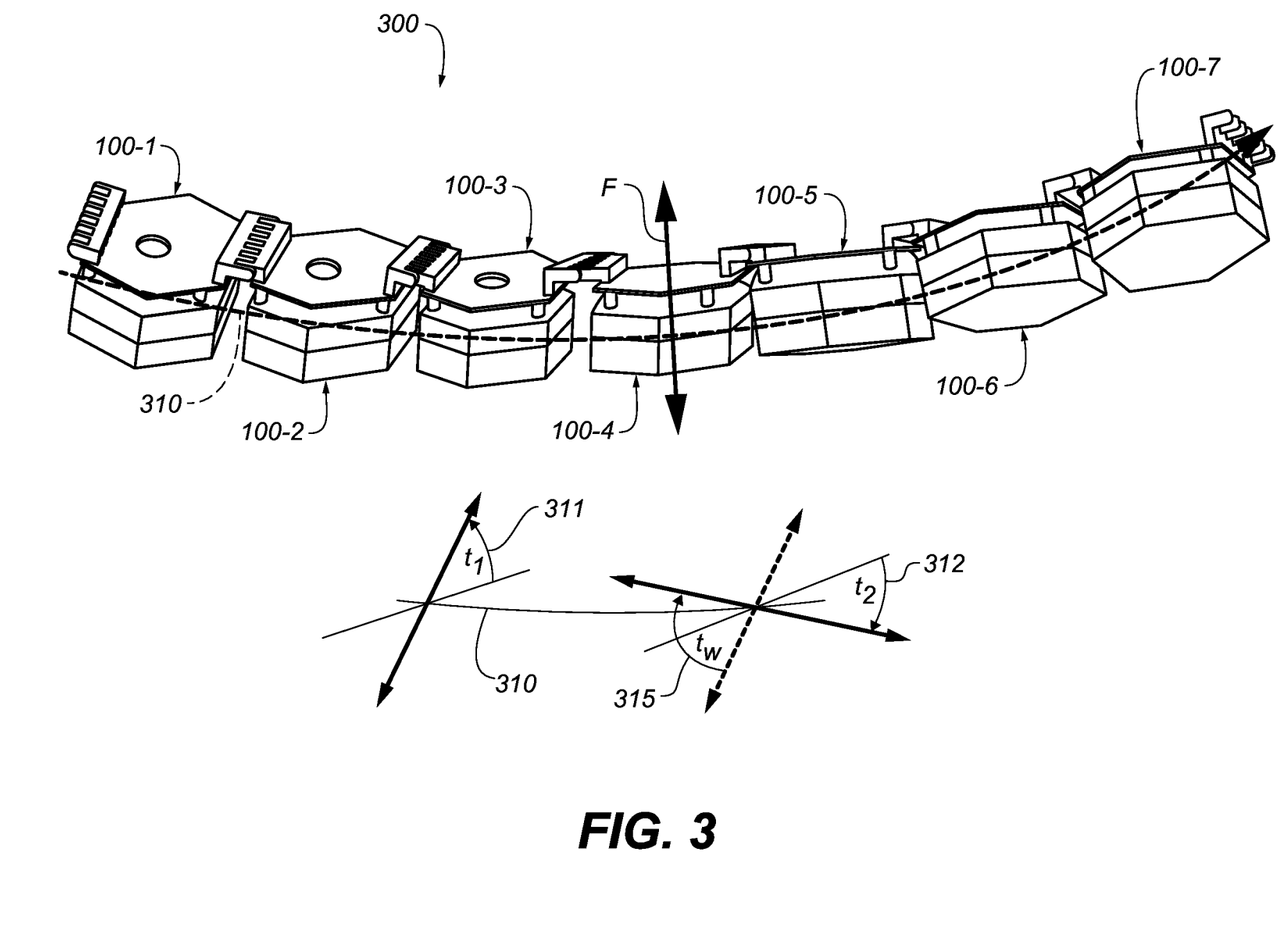
FIG. 3 illustrates a chain of substrates linked in a non-planar configuration, according to some embodiments.

FIG. 3 illustrates a chain 300 of substrates 100-1 through 100-7 linked in a non-planar configuration, according to some embodiments. Substrates 100-1, 100-2, 100-3, 100-4, 100-5, 100-6, 100-7 (collectively referred hereinafter as substrates 100, cf. FIG. 1), are linked together through connectors 110 and 120. Chain 300 buckles and adopts a compliant shape in curve 310. Chain 300 also complies with a torsional stress that provides a twisting angle 'tw' 315 to substrates 100 along the chain. The twisting of chain 300 may be the result of a twist $t_1$ 311 of element 100-1 about a reference position (say a horizontal position). And the twisting of chain 300 may also be the result of a twist $t_2$ 312 of element 100-7 about the reference position. Accordingly, tw 315 may be the sum of $t_1$ 311 and $t_2$ 312, i.e., in some embodiments: $tw=t_1+t_2$. Thus, any two adjacent substrates 100 along chain 300 lie in two planes forming a twist angle that is greater than zero. Tw 315 is the addition of all the twist angles between adjacent substrates 100 along chain 300.

FIG. 3 illustrates a force F that may be applied to one of substrates 100 (i.e., substrate 100-4) to remove it from chain 300. Accordingly, removal of substrate 100-4 may be convenient for replacing, repairing, or updating substrate 100-4 without disassembling other substrates 100 from chain 300. Curve 310 may also indicate a direction of flow of an electrical current providing electrical power to each of substrates 100. Accordingly, the direction of current flow is not limiting of embodiments consistent with the present disclosure. Moreover, in some embodiments a plurality of electric currents may flow in different directions along curve 310. The plurality of current flows may include electrical power lines and data transmission lines for substrates 100.

Figure 4A:
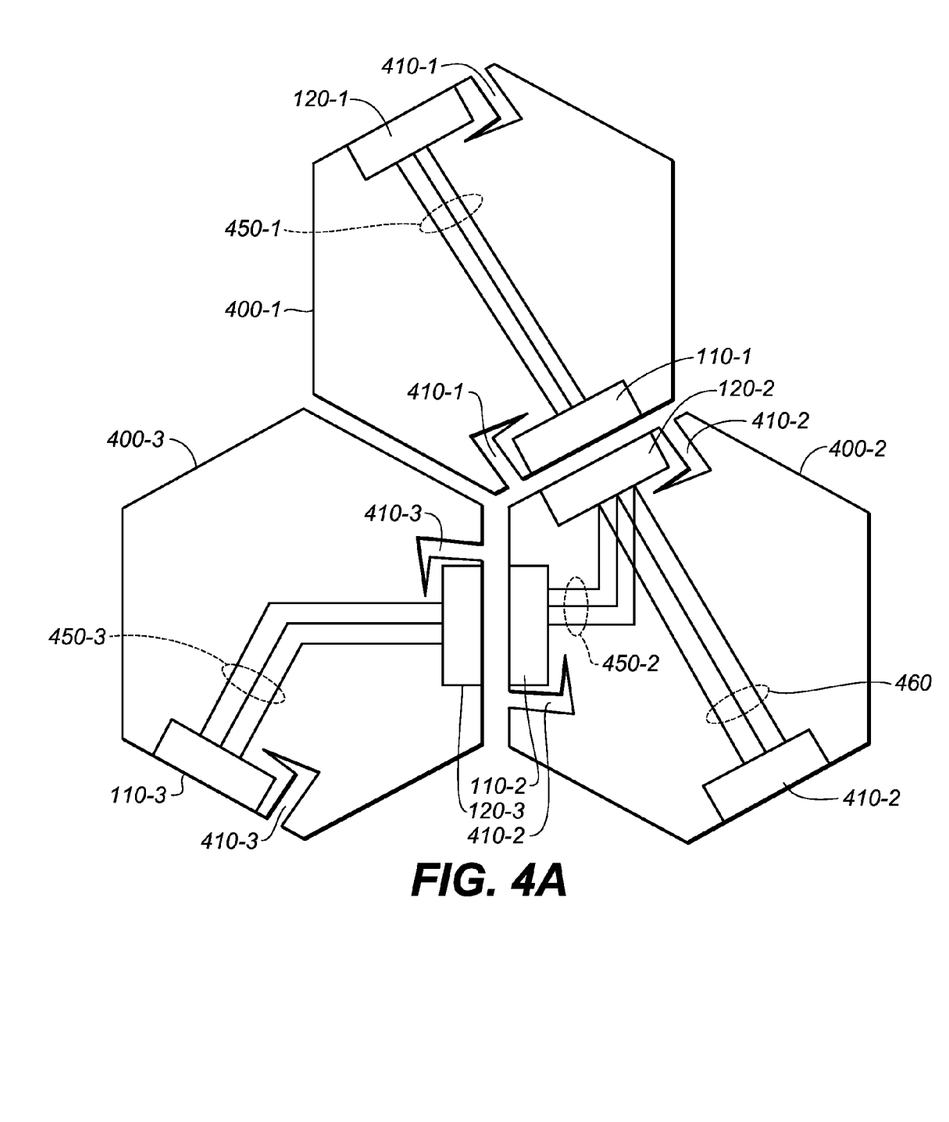
FIG. 4A illustrates linked substrates including board to board connectors for a non-planar configuration, according to some embodiments.

FIG. 4A illustrates linked substrates 400-1, 400-2, and 400-3 including board to board connectors 110 and 120 for a non-planar configuration, according to some embodiments. Substrates 400-1, 400-2, and 400-3 (collectively referred hereinafter to as substrates 400) include recess 410-1 and 410-2 in the proximity of connectors 110 and 120, respectively. Recess 410-1 is located proximal to pin contact 110, and recess 410-2 is located proximal to blade contact 120. Recesses 410 provide torsional stress relief to the interlocking connection between substrates 400. The stress relief allows links formed by substrates 400-1, 400-2, and 400-3 to adopt a non-planar configuration. For example, recess 410-1 and recess 410-2 are configured to allow substrate 400-1 and substrate 400-2 to form a twist angle tw (cf. tw 315, FIG. 3). Thus, recess 410-1 allows each of substrates 400 to be 'plucked' in and out of the meshed network without accumulating stress in a PCB board in the substrate. While substrates 400-1 and 400-2 in FIG. 4A have hexagonal profiles forming a non-planar 'honey-comb' fabric, this is not limiting of embodiments consistent with the present disclosure. Moreover, one of ordinary skill will recognize that substrates 400-1, 400-2, and 400-3 may have a different shapes and sizes.

FIG. 4A illustrates electric power and data transmission lines 450-1, 450-2, and 450-3 (hereinafter referred to as 'tracks' 450). Tracks 450 provide electrical coupling between connector 120 in one side of substrate 400 and connector 110 in another side of substrate 400. Accordingly, tracks 450 may follow curved trajectories within substrate 400. For example, tracks 450-2 may end in order to reach from connector 120-2 in one side of substrate 400-2 to connector 110-2 in an adjacent side of substrate 400-2. Moreover, as shown in FIG. 4A, a substrate 400 may include more than one pin connector 110 or more than one blade connector 120. Likewise a substrate 400 may include more than one set of tracks. For example, substrate 400-2 includes track 450-2 coupling blade connector 120-2 to pin connector 110-2 and track 460, coupling blade connector 120-2 to a second pin connector 410-2. Second pin connector 410-2 may be as any one of pin connectors 110 described in detail above (cf. FIG. 1).

Accordingly, embodiments of the present disclosure provide a network mesh of substrates 400 electrically and mechanically coupled to each other. In some embodiments, the network mesh is a 3D network mesh where one substrate may be coupled to one, two, or more other substrates. The electrical and mechanical coupling between adjacent substrates may be provided by a pin connector interlocked with a blade connector (e.g., pin connector 110 and blade connector 120). In some embodiments, adjacent substrates may include a first connector for mechanical coupling and a second connector for electrical coupling.1

Figure 4B:
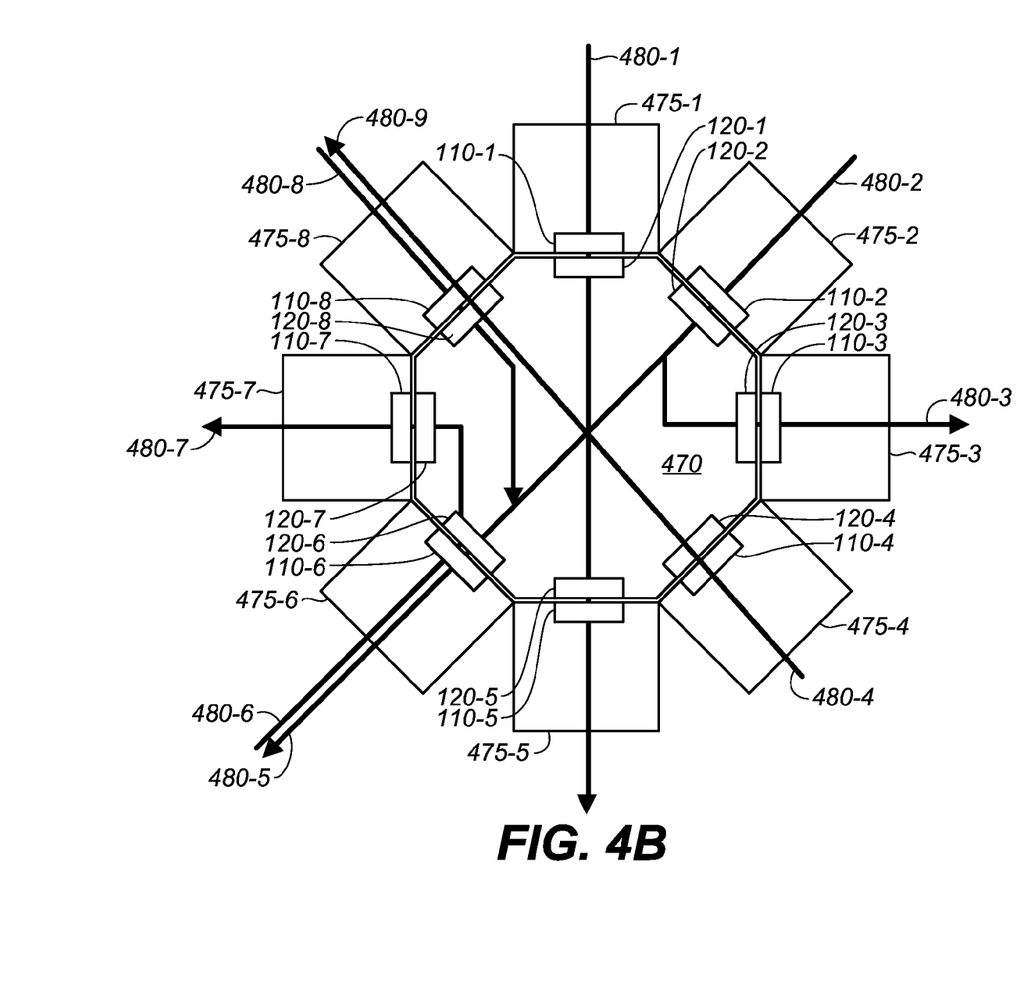
FIG. 4B illustrates linked substrates including board to board connectors for a non-planar configuration, according to some embodiments.

FIG. 4B illustrates linked substrates 470 and 475-1 through 475-8 (hereinafter referred collectively as substrates 475). FIG. 4B includes board to board connectors 110-1 through 110-8, and 120-1 through 120-8 for a non-planar configuration, according to some embodiments. FIG. 4B illustrates that the relative shape and size of two adjacent substrates in a non-planar configuration as disclosed herein may not be the same. For example, substrate 470 has an octagonal shape, and substrates 475 have a smaller square shape. Connectors 110 and 120 may be 'pin' connectors and 'blade' connectors, as discussed in detail above (cf. FIG. 1).

FIG. 4B also illustrates electric power lines and data transmission lines along tracks 480-1 through 480-9 (collectively referred hereinafter as 'tracks' 480). Accordingly, tracks 480 form a complex pattern on substrate 470. For example, track 480-2 may electrically couple substrate 475-2 to substrate 470 and to substrate 475-3 by splitting into track 475-3. Likewise, substrate 475-8 may be electrically coupled to substrate 475-6 by merging onto track 480-5 in substrate 470. And substrate 475-6 may be electrically coupled to substrate 475-7 through tracks 480-6 and 480-7. As shown in FIG. 4B, track 480-4 may electrically couple substrates 475-4, 470, and 475-8. Electrical coupling as in embodiments disclosed herein may include electrical coupling through a power line, a data transmission line, or both. In that regard, of all the tracks formed in substrate 470 only one, or none, may be coupled to an active circuit in substrate 470 through a collection pin (e.g., collection pin 230, cf. FIG. 2C).

Accordingly, substrate 470 may be a node in the meshed network, and each of tracks 48-0-1 through 480-9 may have a different impedance, capacitance, or time response constant. Thus, substrate 470 may draw or distribute electrical power to and from the network through multiple paths. Furthermore, substrate 470 may select a path of least resistance or least capacitance through the meshed network in order to distribute electrical power and data transmission.

Figure 5:
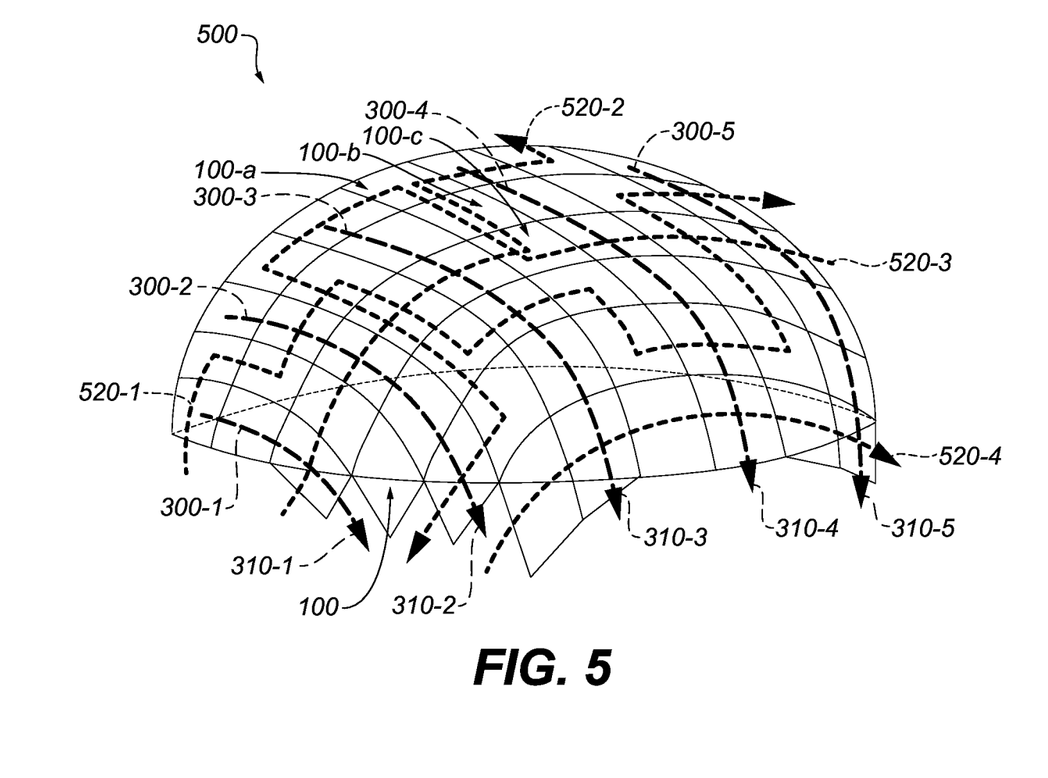
FIG. 5 illustrates a fabric of substrates linked in a non-planar configuration, according to some embodiments.

FIG. 5 illustrates a fabric 500 of substrates linked in a non-planar configuration, according to some embodiments. Fabric 500 includes a plurality of chains 300-1, 300-2, 300-3, 300-4, 300-5, 300-6, and 300-7, collectively referred hereinafter as 'chains' 300 (cf. FIG. 3). Chains 300 adopt curved traces 310-1, 310-2, 310-3, 310-4, and 310-5 resulting in a 3D-surface for fabric 500. Fabric 500 may be adapted to have an ergonomic shape. Fabric 500 may be adapted to have a functional shape, such as a microphone or a speakerphone having stereophonic quality. For example, the surface of fabric 500 may be adapted to conform to an arm, a leg, the torso, or the head of a user. Also, fabric 500 may be shaped to provide an added functionality to the collective operation of active elements 150 in each of substrates 100 included in fabric 500. In some embodiments fabric 500 may adapt a ball shape approximately spherical.

In some embodiments, substrate fabric 500 includes a plurality of substrates 100 having active electrical components and further including a plurality of substrates linked together to form a curved surface, and at least two adjacent substrates each of the two having a first linkable element and a second linkable element. Each linkable element including a conductive material. The first linkable element in one of the at least two adjacent substrates engages the second linkable element in the other one of the at least two adjacent substrates. Accordingly, the first linkable element may be as pin connector 110 (cf. FIG. 1). And the second linkable element may be as blade connector 120 (cf. FIG. 1).

In some embodiments, electrical power and data transmission to each of substrates 100 in fabric 500 may follow curves 310 along chains 300. In some embodiments, electrical power and data transmission to each of substrates 100 in fabric 500 may follow arbitrary trajectories along the surface of fabric 500. For example, electrical power lines and data transmission lines may follow tracks 520-1, 520-2, 520-3, and 520-4 (hereinafter referred collectively as tracks 520). In that regard, each of the electrical power lines and the data transmission lines include a sequence of substrates 100. The sequence of substrates may cross over each other, or may be parallel to each other, according to embodiments consistent with the present disclosure. Moreover, the sequence of substrates along one track may include some substrates that belong to another track. For example, track 520-3 and track 520-2 share substrates 100-$a$, 100-$b$, and 100-$c$.

Figure 6:
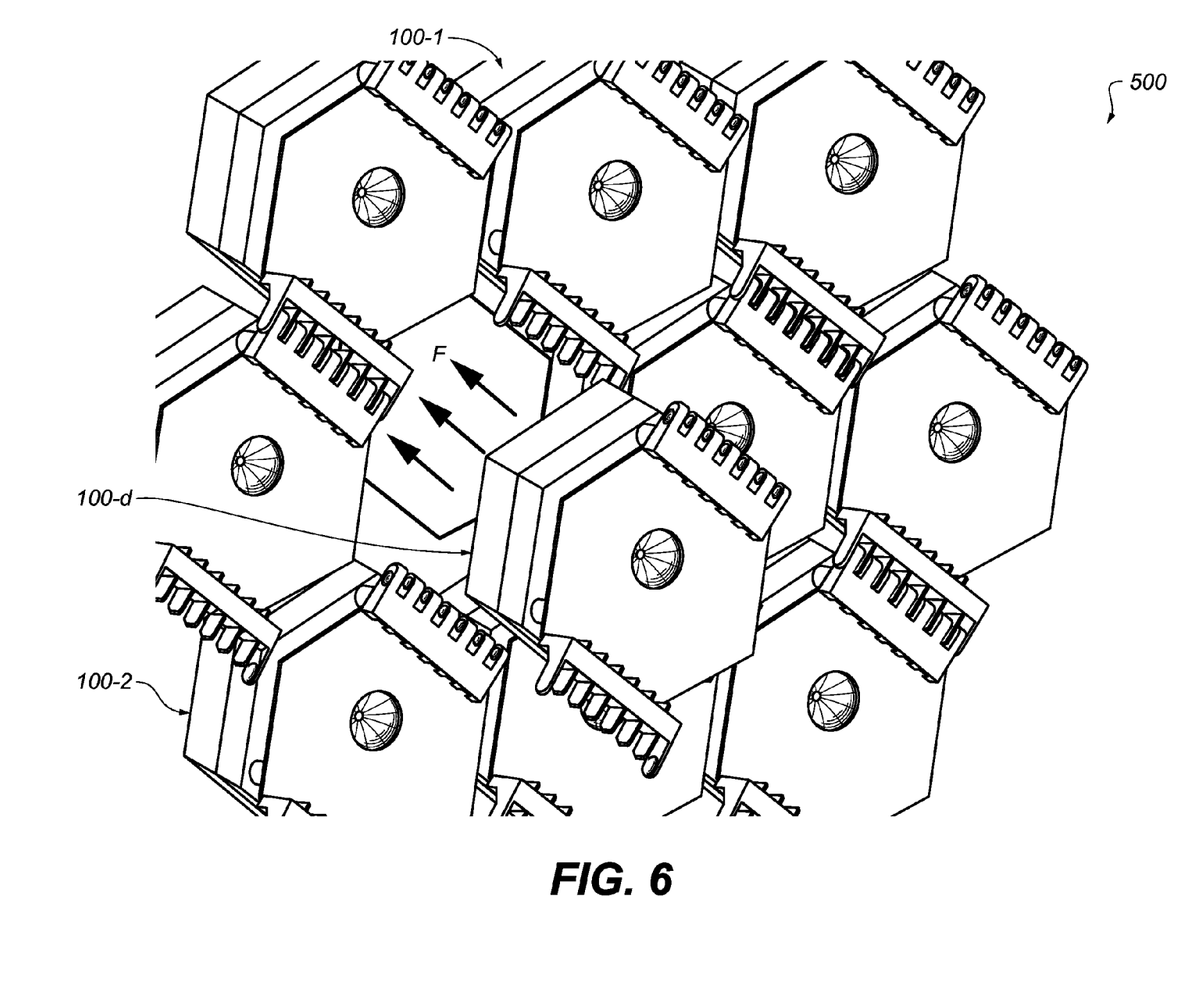
FIG. 6 illustrates placement of a substrate in a non-planar fabric, according to some embodiments.

FIG. 6 illustrates placement of substrate 100-$d$ in non-planar fabric 500, according to some embodiments. A force F is applied so that connector 111 of substrate 100-$d$ engages connector 121 in a substrate 100-1 adjacent to a first side of substrate 100-$d$. Force F also engages connector 121 in substrate 100-$d$ to connector 111 in a substrate 100-2 adjacent to a second side of substrate 100-$d$. In some embodiments, the first side and the second side of substrate 100-$a$ may be opposite to each other, along the substrate perimeter. One of ordinary skill will realize that other configurations consistent with the present disclosure may include a first side and a second side in substrate 100-$a$ that are adjacent to one another. Accordingly, fabric 500 has electrical power and data transmission lines forming a meshed network such that removing substrate 100-$d$ from the fabric does not alter the operation of the entire fabric. Likewise, substrate 100-$d$ may include a 'plug-and-play' active electronic component such that substrate 100-$d$ starts operating as soon as it is placed in position in fabric 500. In some embodiments, each of the substrates 100 included in fabric 500 may be placed in any desired order without affecting the operation of the entire fabric for its intended purpose. Moreover, fabric 500 may be constantly adapted to have new shapes, or larger shapes and configurations by simply adding more substrates 100 to the meshed network. Furthermore, fabric 500 may be adapted to change its 3D shape by adjusting the twisting angle (e.g., tw 315, cf. FIG. 3) between adjacent substrates without compromising the electrical coupling between the substrates. Accordingly, in some embodiments fabric 500 has a designed flexibility that allows the 3D structure to adapt to different shapes according to the application.

Figure 7:
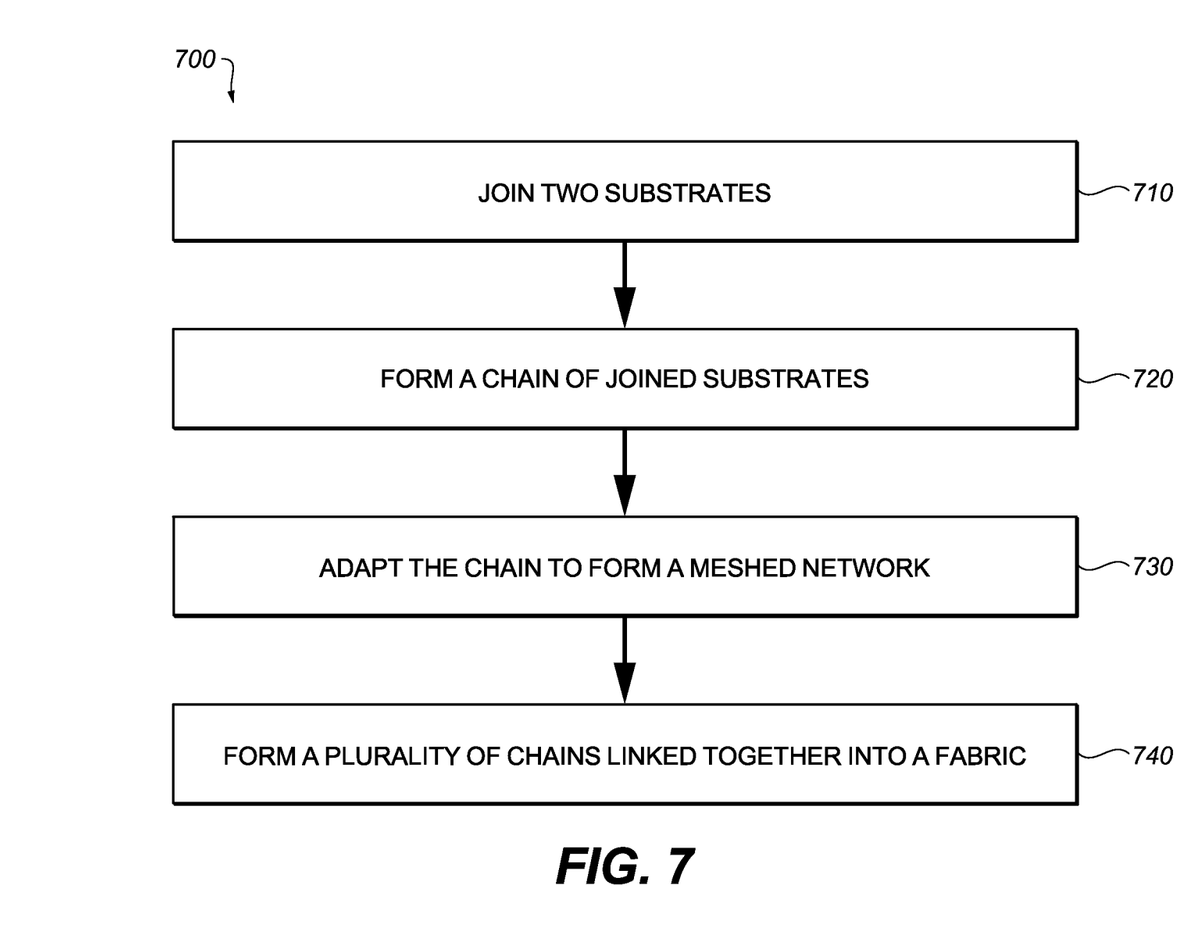
FIG. 7 illustrates a flow chart of steps in a method of forming a substrate fabric in a non-planar configuration, according to some embodiments.

FIG. 7 illustrates a flow chart of steps in a method 700 of forming a substrate fabric in a non-planar configuration, according to some embodiments. The substrate fabric in method 700 may include a plurality of substrates linked into chains (e.g., substrate 100 in FIG. 1, chains 300 in FIG. 3, and fabric 500 in FIG. 5). Each of the plurality of substrates forming the fabric in method 700 may include a first connector and a second connector (e.g., connector 110 and connector 120, cf. FIG. 1). Furthermore, in some embodiments the first connector and the second connector may include latch detents to provide a secure mechanical coupling to a link formed between two adjacent substrates in the fabric (e.g. latch detents 112 and 122, cf. FIG. 1).

Step 710 includes joining two substrates to form a link. Accordingly, step 710 may include engaging the first connector in a first substrate with the second connector in a second substrate. For example, in some embodiments step 710 may include squeezing blades in the second connector of the second substrate within pins in the first connector of the first substrate (e.g., blades 121 and pins 111, cf. FIG. 1). Furthermore, in some embodiments step 710 may include engaging the latching detents in the first connector of the first substrate with the latching detents in the second connector of the second substrate. Thus, step 710 may include interlocking the fingers or protrusions of the first connector and the second connector in adjacent substrates.

Step 720 includes forming a chain of joined substrates from a plurality of links formed according to step 710. Accordingly, step 720 may include forming a first link between the first substrate and a second substrate adjacent to the first substrate as in step 710. Step 720 may include engaging the first connector in the first substrate to a second connector in the second substrate. Also, step 720 may include repeating step 710 between the first substrate and a third substrate adjacent to the first substrate. Step 720 may include forming a second link between the first substrate and the third substrate. Accordingly, step 720 may include engaging the second connector in the first substrate with a first connector in the third substrate.

Step 730 includes adapting the chain to form a meshed network. In some embodiments, step 730 may include providing a twisting angle between the first substrate and the second substrate in step 720 (e.g., tw 315, cf. FIG. 3).

Step 740 includes forming a plurality of chains linked together into a fabric. Accordingly, step 740 may include adapting the fabric into a curved shape having ergonomic properties, as discussed in detail above in relation to fabric 500 (cf. FIG. 5). Adapting the fabric into a curved shape may include a curved shape providing improved functionality to the aggregated effect of the substrates included in the fabric.

Figure 8:
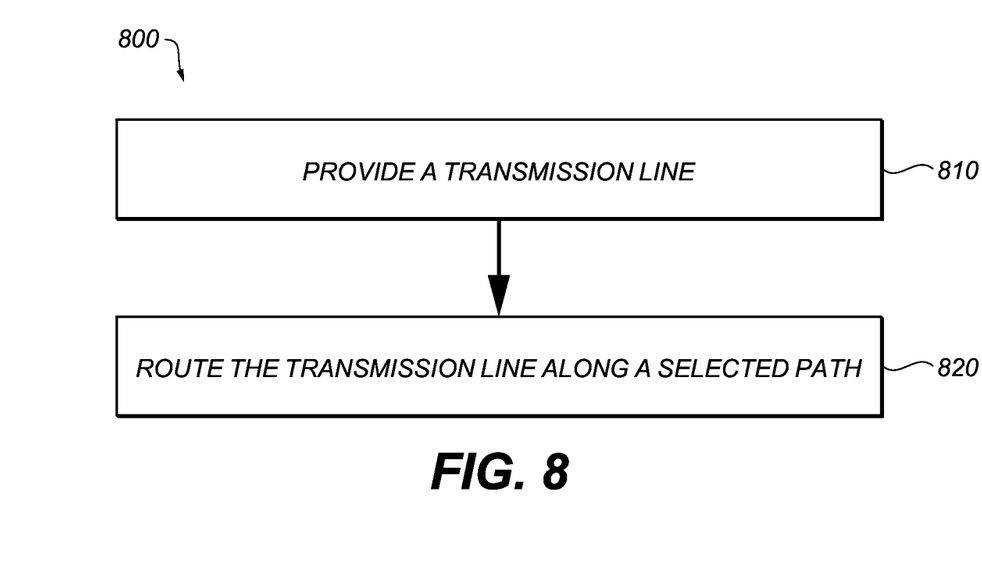
FIG. 8 illustrates a flow chart of steps in a method of activating an electronic device including a meshed network of electrical components, according to some embodiments.

FIG. 8 illustrates a flow chart of steps in a method 800 of activating an electronic device including a meshed network of electrical components, according to some embodiments. The meshed network in method 800 may include a plurality of substrates linked into chains (e.g., substrate 100 in FIG. 1, chains 300 in FIG. 3, and fabric 500 in FIG. 5). Each of the plurality of substrates forming the meshed network in method 800 may include a first connector and a second connector (e.g., connector 110 and connector 120, cf. FIG. 1). Furthermore, in some embodiments the first connector and the second connector may include latch detents to provide a secure mechanical coupling to a link formed between two adjacent substrates in the fabric (e.g. latch detents 112 and 122, cf. FIG. 1).

Step 810 includes providing a plurality of transmission lines through the meshed network. In some embodiments step 810 may include providing an electrical power line and a data transmission line. Step 820 includes dynamically routing at least one of the transmission lines along a selected path. In some embodiments, step 820 may include selecting a path of least resistance in a power transmission line. In some embodiments, step 820 may further include selecting a path of least bit-error-rate in a data transmission line.

The various aspects, embodiments, implementations or features of the described embodiments can be used separately or in any combination. Various aspects of the described embodiments can be implemented by software, hardware or a combination of hardware and software. The described embodiments can also be embodied as computer readable code on a computer readable medium for controlling manufacturing operations or as computer readable code on a computer readable medium for controlling a manufacturing line. The computer readable medium is any data storage device that can store data which can thereafter be read by a computer system. Examples of the computer readable medium include read-only memory, random-access memory, CD-ROMs, HDDs, DVDs, magnetic tape, and optical data storage devices. The computer readable medium can also be distributed over network-coupled computer systems so that the computer readable code is stored and executed in a distributed fashion.

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of specific embodiments are presented for purposes of illustration and description. They are not intended to be exhaustive or to limit the described embodiments to the precise forms disclosed. It will be apparent to one of ordinary skill in the art that many modifications and variations are possible in view of the above teachings.

What is claimed is:

1. A mesh network of printed circuit boards (PCBs), comprising:
   a first rigid PCB defining a first securing mechanism;
   a second rigid PCB defining a second securing mechanism;
   wherein the first and second securing mechanisms join one another to form an interlocking connection between the first and second rigid PCBs;
   the interlocking connection is configured to allow the first and second PCBs to form a first twist angle around a first axis that is transverse to the interlocking connection and a second twist angle around a second axis that is oriented at a non-zero angle with respect to the first axis, wherein the first twist angle is formed in response to a torsion applied about the first axis; and
   the interlocking connection is configured to electrically couple the first and second PCBs.

2. The mesh network of claim 1 wherein:
   the first securing mechanism comprises a pin connector in the first PCB having a plurality of pins; and
   the second securing mechanism comprises a blade connector in the second PCB having a plurality of blades;
   wherein the plurality of pins are configured to engage a blade in the blade connector.

3. The mesh network of claim 1 wherein the electrical coupling comprises an electrical power line and a data transmission line.

4. The mesh network as in claim 2 wherein:
the pin connector comprises a pin latching detent configured to engage a blade latching detent in the blade connector;
the pin connector is disposed relating to the blade connector at a non-zero offset angle.

5. The mesh network as in claim 2 wherein:
the pin connector is coupled to a bypass component; and
one of the first PCB and the second PCB further comprise a collection pin to provide an electrical power line and a data transmission line to a board controlling an active electrical component.

6. The mesh network as in claim 2 wherein at least one of the pin connector and the blade connector are hinged on a substrate of the first PCB or the second PCB.

7. The mesh network of claim 2 further comprising:
a first recess proximal to the pin connector in the first PCB; and
a second recess proximal to the blade connector in the second PCB.

8. The mesh network of claim 7 wherein the first recess and the second recess are configured to provide a torsional stress relief to the interlocking connection.

9. A substrate fabric comprising:
first and second adjacent substrates linked together to form a meshed network, each comprising:
a first linkable element and a second linkable element, each linkable element including a conductive material, wherein the first linkable element in the first adjacent substrate engages the second linkable element in the second adjacent substrate to define an interlocking connection, the interlocking connection being located at a first side of the first substrate and a second side of the second substrate;
wherein the first and second adjacent substrates form a twist angle at the interlocking connection in response to a torsion applied about an axis, and the axis extends transverse to the first side of the first substrate and the second side of the second substrate; and
a plurality of traces for electrical power and data transmission lines, each of the traces including at least one electrical connection formed between the first linkable element engaging the second linkable element in the first and second adjacent substrates.

10. The substrate fabric of claim 9 wherein the meshed network forms a three-dimensional surface and each of the substrates includes a plug and play electronic device.

11. The substrate fabric of claim 9 wherein the meshed network has an ergonomic shape.

12. The substrate fabric of claim 11 wherein the ergonomic shape is compliant with a part of the human body.

13. The substrate fabric of claim 9 wherein the first and second adjacent substrates comprise at least one of the group consisting of a microphone, a speakerphone, a display, and a touch sensitive screen.

14. The substrate fabric of claim 9 wherein the first and second adjacent substrates comprise at least one of the group consisting of a pressure sensor and a temperature sensor.

* * * * *